(12) United States Patent
Myhre et al.

(10) Patent No.: US 12,147,084 B2
(45) Date of Patent: Nov. 19, 2024

(54) COOLING DEVICE, A RECEPTACLE ASSEMBLY, A SYSTEM AND A PRINTED BOARD ASSEMBLY

(71) Applicant: Telefonaktiebolaget LM Ericsson (publ), Stockholm (SE)

(72) Inventors: Mikkel Myhre, Järfälla (SE); Samir Saaidi, Stockholm (SE); Gustav Lundmark, Sigtuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 283 days.

(21) Appl. No.: 17/597,618

(22) PCT Filed: Jul. 16, 2019

(86) PCT No.: PCT/SE2019/050696
§ 371 (c)(1),
(2) Date: Jan. 14, 2022

(87) PCT Pub. No.: WO2021/010874
PCT Pub. Date: Jan. 21, 2021

(65) Prior Publication Data
US 2022/0252800 A1    Aug. 11, 2022

(51) Int. Cl.
*G02B 6/42*     (2006.01)
*H05K 7/20*    (2006.01)

(52) U.S. Cl.
CPC ....... *G02B 6/4269* (2013.01); *H05K 7/20336* (2013.01); *H05K 7/2039* (2013.01)

(58) Field of Classification Search
CPC ............. G02B 6/4269; H05K 7/20336; H05K 7/2039; H05K 7/2049; H05K 7/10; H05K 7/1007
See application file for complete search history.

(56) References Cited

U.S. PATENT DOCUMENTS 5,552,635 A     9/1996  Kim et al.
7,764,504 B2 *  7/2010  Phillips .............. H01R 13/6586
                                               174/15.2

(Continued)

FOREIGN PATENT DOCUMENTS

EP      0071748 A2    2/1983
EP      2738804 A2    6/2014
JP      05-013627 A   1/1993

OTHER PUBLICATIONS

International Preliminary Report on Patentability, PCT App. No. PCT/SE2019/050696, Jan. 27, 2022, 8 pages.

(Continued)

*Primary Examiner* — Mandeep S Buttar
*Assistant Examiner* — Matthew Sinclair Muir
(74) *Attorney, Agent, or Firm* — Nicholson De Vos Webster & Elliott LLP

(57) ABSTRACT

A cooling device for cooling a heat generating component, wherein the cooling device comprises a heat sink and at least one heat pipe that is in thermal contact with the heat sink, wherein the at least one heat pipe comprises a thermal contact area that is configured for thermal contact with a heat generating component, and the at least one heat pipe is configured in a shape that provides mechanical spring properties. Such a heat generating component may comprise a pluggable module. Also disclosed is a receptacle assembly comprising a frame having an interior cavity configured for accommodating a heat generating component and having an opening for receiving the heat generating component, characterized in that it comprises a cooling device. Disclosed is also a system comprising a receptacle assembly, and a printed board assembly (PBA) comprising a receptacle assembly.

15 Claims, 4 Drawing Sheets

(56) References Cited

U.S. PATENT DOCUMENTS

| | | | |
|---|---|---|---|
| 7,800,910 B2* | 9/2010 | Seynaeve | H05K 5/0286 |
| | | | 165/185 |
| 8,879,262 B2 | 11/2014 | Shi | |
| 10,091,911 B2* | 10/2018 | Kelty | G02B 6/4269 |
| 10,567,084 B2* | 2/2020 | Zhang | H04B 1/38 |
| 2005/0219820 A1* | 10/2005 | Belady | G06F 1/20 |
| | | | 361/700 |
| 2007/0253168 A1 | 11/2007 | Miller | |
| 2009/0040760 A1* | 2/2009 | Chen | F21V 29/89 |
| | | | 362/373 |
| 2014/0153192 A1* | 6/2014 | Neer | H05K 9/0058 |
| | | | 361/704 |
| 2015/0029667 A1 | 1/2015 | Szczesny | |
| 2017/0142864 A1 | 5/2017 | Chanu et al. | |
| 2020/0100386 A1* | 3/2020 | Saturley | H05K 7/20336 |
| 2020/0257067 A1* | 8/2020 | Meunier | G02B 6/4284 |

OTHER PUBLICATIONS

Supplementary European Search Report and Search Opinion, EP App. No. 19938067.6, Jun. 14, 2022, 10 pages.
International Search Report and Written Opinion for Application No. PCT/SE2019/050696, Mar. 6, 2020, 11 pages.

\* cited by examiner

US 12,147,084 B2

COOLING DEVICE, A RECEPTACLE ASSEMBLY, A SYSTEM AND A PRINTED BOARD ASSEMBLY

CROSS-REFERENCE TO RELATED APPLICATIONS

This application is a National stage of International Application No. PCT/SE2019/050696, filed Jul. 16, 2019, which is hereby incorporated by reference.

TECHNICAL FIELD

The present disclosure relates generally to the field of cooling of heat generating components, and in particular cooling of pluggable modules. Examples of pluggable modules are small form factor pluggables (SFP) and quad small form factor pluggables (QSFP), such as optical transceiver modules used in telecommunication equipment. More particularly, it relates to a cooling device, a receptacle assembly comprising a cooling device, a system comprising a receptacle assembly and a heat generating component, and a printed board assembly (PBA) comprising a receptacle assembly.

BACKGROUND

Optimized and robust thermal/mechanical design of telecommunication equipment is crucial to meet continuously increasing market requirements on performance, robustness, volume, weight, acoustic noise, energy efficiency, etc. SFP's and QSFP's often constitute a thermal bottleneck in the thermal design.

Board mounted components/devices, such as SFP's are often cooled by means of a common (to the system PBA in question) chassis heatsink. A gap between such components/devices and the heatsink is necessary in order to address mechanical tolerances. A thermal interface material (TIM) is thus needed to transfer the heat from the component/device to the heatsink. Common TIMs used for this purpose includes e.g. "gappads" and other "fillers" such as "putty".

Some prior art examples are shown in FIGS. 1 and 2, showing a PBA 1, an SFP 2, a cage 3 receiving the SFP, and a heat sink 4. In FIG. 1 is shown how a TIM 5 is arranged between the cage 3 and the heat sink 4. In FIG. 2 is shown another variant in which a block of aluminium 6 or other thermally conducting material is arranged in an upper opening of the cage 3. The aluminium block is in direct contact with the SFP. A TIM 5 is arranged between the aluminium block 6 and the heat sink 4. A similar device is also known from U.S. Pat. No. 8,879,262.

Heat pipes have also been used for transferring heat from SFP & QSFP cages to other parts of the structure. An example using a heat pipe is disclosed in U.S. Pat. No. 7,764,504.

Although the heat dissipation from commercial SFP modules (order of magnitude 2-3 W) and QSFP modules (order of magnitude 5-6 W), is relatively modest, the thermal chain from SFP to heatsink is compromised due to the inherent thermal resistances of the existing cooling solutions.

Furthermore, existing cooling solutions faces challenges with SFP insertion/extraction forces in relation to market requirements for the SFP's, due to the friction force exerted on the (Q)SFP in the existing cooling solutions.

Therefore, there is a need for improved thermal/mechanical design of board mounted components/devices, such as SFP's, in telecommunication equipment.

SUMMARY

It is an object of the present disclosure to solve or mitigate, alleviate, or eliminate at least some of the above or other disadvantages.

According to one aspect, this is achieved by a cooling device for cooling a heat generating component, wherein the cooling device comprises a heat sink and at least one heat pipe that is in thermal contact with the heat sink, wherein the at least one heat pipe comprises a thermal contact area that is configured for thermal contact with a heat generating component, and the at least one heat pipe is configured in a shape that provides mechanical spring properties.

A heat pipe is made of a highly thermally conductive material. It contains a liquid that vaporises when heated and condenses when cooled. It combines the principles of both thermal conductivity and phase transition to effectively transfer heat between two solid interfaces. Heat pipes are usually made of a material that makes them flexible and allows them to be bent into any shape that is suitable for the purpose of use. They can e.g. be made of copper and contain water as the working fluid.

The mechanical spring properties, or elastic energy storage properties, of heat pipes can be obtained in a number of different ways, as will be described.

The cooling device is configured to provide heat transfer from a heat generating component to the heat sink via the heat pipe. By using a heat pipe having mechanical spring properties to provide heat transfer from a heat generating component to a heat sink, is obtained the advantage that any changes to the distance between the heat generating component and the heat sink can be absorbed by the flexibility of the heat pipe. A heat pipe itself also bring advantages such as efficient heat transfer and cooling, part of it may even be integrated in the bottom of the heat sink. Furthermore, the mechanical spring property of the heat pipe may be used to obtain a biasing force that will exert a pressure force against the heat generating component during insertion into a frame in which it is located during use, and which pressure force is released when the heat radiating component is extracted from the frame. The biasing force will make sure that good thermal contact is maintained between the heat pipe and the heat generating component.

According to another aspect is defined a cooling device for cooling a heat generating component, wherein the cooling device comprises a heat sink and at least one heat pipe that is in thermal contact with the heat sink, wherein the at least one heat pipe comprises a thermal contact area that is configured for thermal contact with a heat generating component comprising a pluggable module, and the at least one heat pipe is configured in a shape that provides mechanical spring properties.

In the case of the heat generating component being a pluggable module, such as a SFP or QSPF as described above, the use of a heat pipe for heat transfer from a heat generating component to a heat sink makes it possible to avoid use of gappads or other fillers that may deteriorate over time such that they no longer fulfils the requirements for mechanical tolerances.

According to one example embodiment, the heat pipe comprises at least one first portion comprising a first thermal contact area that is configured to be at least partly in thermal contact with the heat generating component, at least one second portion that is configured to be at least partly in thermal contact with the heat sink, and at least one third portion that is connected to the first portion and connected to the second portion. This is one example of a suitable shape of a heat pipe.

By thermal contact between the thermodynamic system of the heat pipe and the thermodynamic system of the heat sink and the heat generating component respectively, is intended that the systems can exchange energy. The exchange of energy can be done by direct physical contact between the heat pipe and the heat generating component, i.e. by thermal conduction, or by indirect contact via e.g. a gas such as vacuum or air, i.e. by thermal radiation, and/or via another heat transfer element, or a combination thereof. The exchange of energy between the heat pipe and the heat sink would usually be achieved by direct contact, i.e. thermal conduction. The expression thermal contact between the heat pipe and a heat generating component will therefore also include the case when a heat generating component is located in a frame, and there is thermal contact by thermal conduction between a heat pipe and a frame and thermal contact by thermal radiation between the heat generating component and the frame.

According to one example embodiment, the third portion of the heat pipe comprises at least a part that has a shape that provides mechanical spring properties.

According to one example embodiment, the third portion comprises at least a part that forms an acute angle or an obtuse angle to at least one of the first portion and the second portion, and thereby achieving mechanical spring properties.

In one example embodiment, the heat pipe comprises a first end portion and a second end portion that are in thermal contact with the heat sink, an intermediate portion that comprises a thermal contact area that is configured to be at least partly in thermal contact with a heat generating component, a first connecting portion that connects the first end portion with the intermediate portion and a second connecting portion that connects the second end portion with the intermediate portion, wherein the respective first and second connecting portion comprises at least a part that forms an acute angle or an obtuse angle in relation to the first and second end portion. In this example, the previously mentioned first portion comprises the intermediate portion, the previously mentioned second portion comprises the first and second end portions, and the previously mentioned third portion that is connected to the previously mentioned first and second portions comprises the first and second connecting portions. The respective first and second connecting portion may each extend such that it comprises at least a part that forms an acute angle in relation to the intermediate portion. In one example, the heat pipe comprises a first end portion that comprises a thermal contact area that is configured to be at least partly in thermal contact with the heat generating component, a second end portion that is in thermal contact with the heat sink, and an intermediate portion that connects the first end portion with the second end portion diagonally and which comprises at least a part that forms an acute angle or an obtuse angle in relation to the second end portion. In this example, the previously mentioned first portion comprises the first end portion, the previously mentioned second portion comprises the second end portion, and the previously mentioned third portion, connecting the previously mentioned first and second portions, comprises the intermediate portion. The intermediate portion may extend such it comprises at least a part that forms an acute angle in relation to the first end portion.

In some example embodiments, the heat pipe is a flat heat pipe. A flat heat pipe has the advantage of requiring less space between the heat sink and the heat generating component, and also being relatively easy to shape and bend into a desired form. The contact area obtained by a flat heat pipe is also larger, which is an advantage.

According to another aspect is defined a receptacle assembly comprising a frame having an interior cavity configured for accommodating a heat generating component and having an opening for receiving the heat generating component. The receptacle assembly is characterized in that it comprises a cooling device, as described in any one of the examples above. By having a cooling device comprising at least one heat pipe configured in a shape that provides mechanical spring properties is obtained many advantages. The heat pipe may e.g. be used to exert a biasing force on the frame or on the heat generating component, when a heat generating component is inserted into the cavity of the frame. Thermal power can be transferred efficiently without violating insertion or extraction force requirements for pluggable modules as defined according to standards, such as MSA (Multi Source Agreement). Robustness over time can be improved since heat pipes do not deteriorate in the same way as e.g. the previously used thermal interface materials. Lower thermal resistance compared to existing cooling solutions can also be obtained, resulting in lower cost, lower weight, less volume demand, lower power consumption, and/or less acoustic noise of the product. Power consumption can be reduced in terms of lower fan speeds in the case of forced convection solutions.

Accordingly, in one example embodiment, the heat pipe is configured to exert a biasing force on the frame. Thereby is obtained good thermal contact and conduction between the heat pipe and the frame.

As previously explained, thermal contact between the heat pipe and the heat generating component can be done by direct physical contact between the heat pipe and the heat generating component, i.e. by thermal conduction, or by indirect contact via e.g. a gas such as vacuum or air, i.e. by thermal radiation, and/or via another heat transfer element, or a combination thereof. Consequently, the heat pipe being in thermal contact with the heat generating component does not necessarily mean that the heat pipe is in direct, physical contact with the heat generating component. Instead, the heat pipe may be in physical contact with the frame and thereby cooling the frame, and thermal contact between the heat pipe and the heat generating component can thus occur via the frame acting as a heat transfer element.

According to another example embodiment, the heat pipe is configured to exert a biasing force on a heat generating component during insertion into the cavity of the frame and to become resiliently deformed when a heat generating component is inserted into the cavity of the frame.

The extraction of a heat generating component will result in that the heat pipe will resume its original shape, since the occurred deformation during insertion was resilient. It should be mentioned that the actual deformation of the heat pipe is very small. The deformation would usually occur in the portion of the heat pipe that comprises an angular part, and the deformation would then comprise slightly bending the concerned part of the heat pipe to a somewhat more acute angle or more obtuse angle, depending on the configuration of the heat pipe.

According to one example, the heat pipe is configured to be in thermal contact with the heat generating component via a heat transfer element of the frame and/or directly with the heat generating component. A heat transfer element of the frame may be a physical part of the frame. The heat pipe may be in direct physical contact with the frame, and thereby thermal conduction between the heat pipe and the frame will take place.

In one example, the frame comprises a thermally conductive element supported in the frame and forming a heat transfer element of the frame and which thermally conductive element is configured to be in thermal contact with a heat generating component accommodated in the cavity of the frame. Such a thermally conductive element may be in direct contact with the heat generating component, and thereby thermal conduction between the thermally conductive element and the heat generating component may take place, as well as thermal conduction between the heat pipe and the thermally conductive element. It is for example previously known to have a block of aluminium located in an opening in the frame and being in contact with a heat generating component such as a pluggable module. The thermally conductive element may e.g. comprise a block of aluminium or similar. The heat pipe may be located on a surface of the thermally conductive element, or, as an alternative, be partly embedded in such a thermally conductive element.

In one example, the frame comprises a top opening facing towards the heat sink, wherein the heat pipe penetrates into the cavity via the top opening and is configured to enter into thermal contact with a heat generating component when a heat generating component is accommodated in the cavity. The heat pipe may thus be in direct physical contact with a heat generating component when such a component is inserted into the frame.

According to one aspect is defined a system comprising a receptacle assembly in accordance with any one of the examples described above, and comprising a heat generating component that is insertable into the cavity of the frame. The heat generating component may be a pluggable module.

According to another aspect is provided a printed board assembly (PBA) comprising a receptacle assembly according to anyone of the examples described above. Naturally, a PBA may have many such assemblies.

The heat sink may be any suitable kind of device functioning as a heat dissipator and which transfers heat generated within a solid material to a fluid medium by thermal radiation. It may e.g. be a heat sink including fins or a simple cold plate. It may be an enclosure for electronics. In the present case, the heat sink would absorb heat from a heat pipe being in physical contact with the heat sink, i.e. heat transfer from heat pipe to heat sink by thermal conduction.

It may be emphasised that, generally, the mentioned heat generating component may be pluggable module, e.g. a SFP module or a QSFP module, such as a transceiver module, optical or other. Also other types of pluggable modules are conceivable. The heat generating component may also be another type of electric component or electronic device (e.g. a radio module or a power amplifier module) that is inserted in a receptably assembly that comprises a cooling device with a heat pipe having spring properties.

It is emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

In some examples, any of the above aspects may additionally have features identical with or corresponding to any of the various features as explained above for any of the other aspects.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

Elements that are the same or represent corresponding or equivalent elements have been given the same reference numbers in the different figures.

DETAILED DESCRIPTION

Embodiments and examples of the present disclosure will be described and exemplified more fully hereinafter with reference to the accompanying drawings. The solutions disclosed herein can, however, be realized in many different forms and should not be construed as being limited to the examples and embodiments set forth herein.

Figure 1:
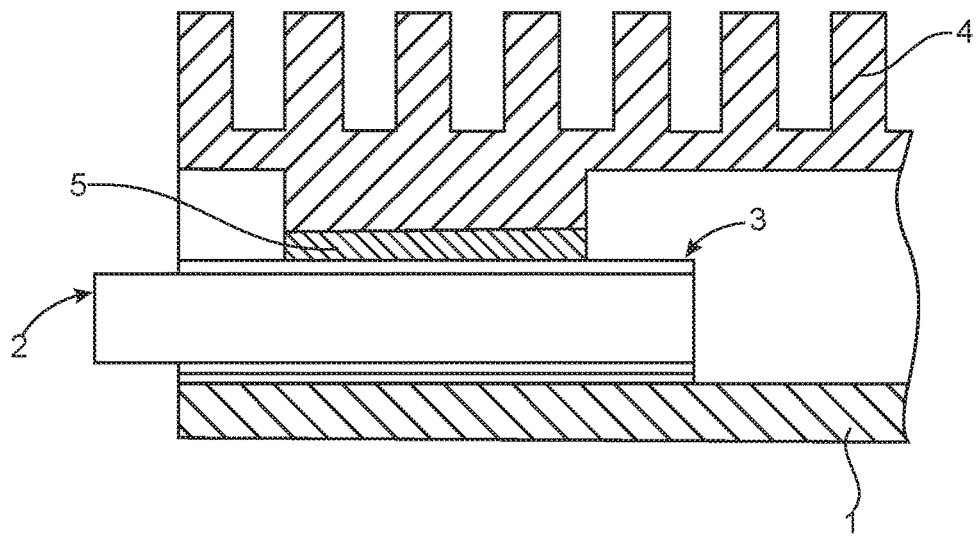
FIG. 1 illustrates schematically a PBA comprising a receptacle assembly with a cooling device in accordance with prior art.
Figure 2:
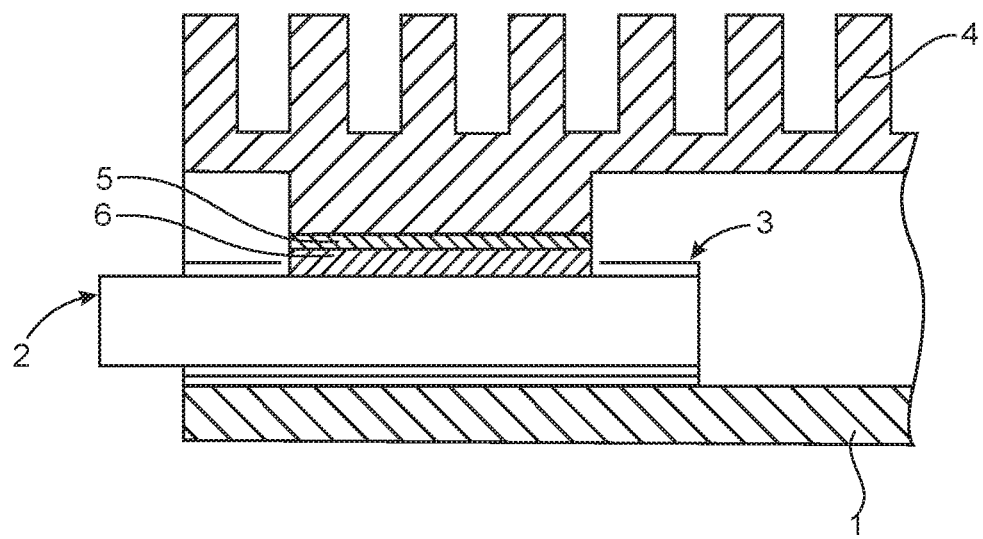
FIG. 2 illustrates schematically a PBA comprising a receptacle assembly with a cooling device in accordance with another variant of prior art.
Figure 3:
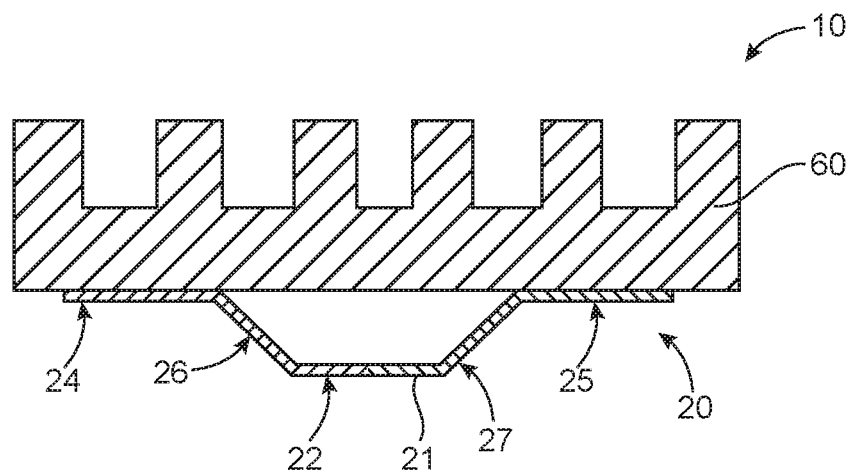
FIG. 3 illustrates schematically an example embodiment of a cooling device.
Figure 4:
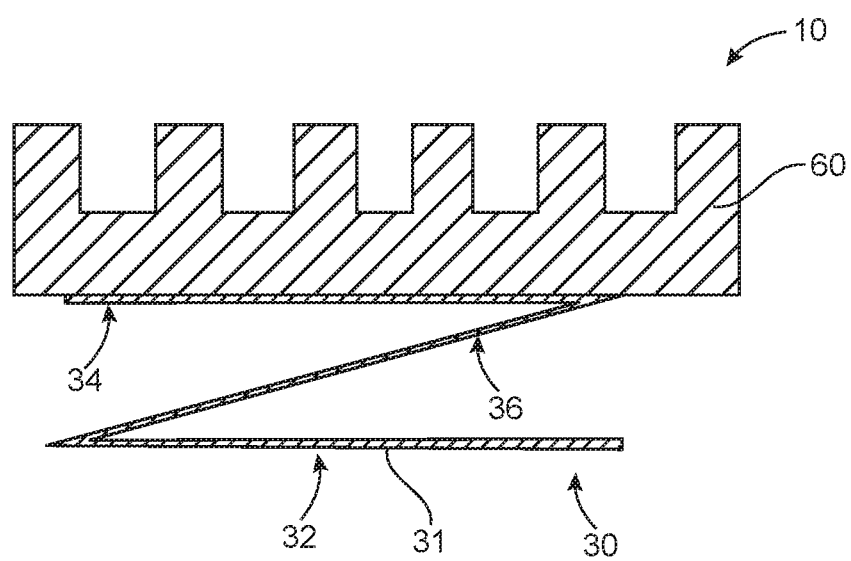
FIG. 4 illustrates schematically an example embodiment of a cooling device.

According to one example, as shown in FIGS. 3-4, is defined a cooling device 10 for cooling a heat generating component (not shown in these figures), wherein the cooling device comprises a heat sink 60 and at least one heat pipe 20, 30 that is in thermal contact with the heat sink. The heat pipe 20, 30 comprises a thermal contact area that is configured for thermal contact with a heat generating component, and the at least one heat pipe is configured in a shape that provides mechanical spring properties. Such a heat pipe may be designed in many different ways. According to one example, the heat pipe 20, 30 comprises at least one first portion 22, 32 comprising a thermal contact area 21, 31 that is configured to be at least partly in thermal contact with a heat generating component, at least one second portion 24, 25, 34 that is configured to be at least partly in thermal contact with the heat sink 60, and at least one third portion 26, 27, 36 that is connected to the first portion 22, 32 and connected to the second portion 24, 25, 34. Generally, the heat pipe would be fastened to the heat sink by any suitable means.

The thermal contact area is configured to face towards a heat generating component. The first portion with the thermal contact area may be configured to extend along the heat generating component, but by that is not necessarily meant that the mentioned first portion extend in the longitudinal direction of the heat generating component. It may e.g. just as well extend across, or at any angle to the longitudinal direction. By "extend along" is intended that the mentioned first portion, where heat transfer takes place, has a certain extension, i.e. is not only a point contact. The same applies to the second portion in relation to the heat sink. The mentioned first and second portion may be configured to extend essentially in parallel to at least the heat sink, and in most cases also to the heat generating component. The thermal contact area configured for thermal contact with a heat generating component may comprise an essentially flat surface in order to provide good thermal contact with the heat generating component or with a frame, as will be explained later.

According to one example, the third portion 26, 27, 36 of the heat pipe 20, 30 comprises at least a part that has a shape that provides mechanical spring properties.

According to one example, the third portion 26, 27, 36 comprises at least a part that forms an acute angle or an obtuse angle to at least one of the first portion 22, 32 and the second portion 24, 25, 34, and thereby achieving mechanical spring properties.

According to the example embodiment shown in FIG. 3, the heat pipe 20 comprises a first end portion 24 and a second end portion 25 that are in thermal contact with the heat sink 60, an intermediate portion 22 comprises a thermal contact area 21 that is configured to be at least partly in thermal contact with a heat generating component, a first connecting portion 26 that connects the first end portion 24 with the intermediate portion 22 and a second connecting portion 27 that connects the second end portion 25 with the intermediate portion 22, wherein the respective first and second connecting portion comprises at least a part that forms an acute angle or an obtuse angle in relation to the first and second end portion. In this illustrated example, the previously mentioned first portion thus comprises the intermediate portion 22, the previously mentioned second portion comprises the first and second end portions 24, 25, and the previously mentioned third portion comprises the first and second connecting portions 26, 27. Naturally, the heat pipe can be shaped vice versa, in that it can be turned upside down with the end portions facing towards the heat generating component and the intermediate portion being in thermal contact with the heat sink.

According to the example embodiment shown in FIG. 4, the heat pipe 30 comprises a first end portion 32 that comprises a thermal contact area that is configured to be at least partly in thermal contact with a heat generating component, a second end portion 34 that is in thermal contact with the heat sink 60, and an intermediate portion 36 that connects the first end portion 32 with the second end portion 34 diagonally and which comprises at least a part that forms an acute angle or an obtuse angle in relation to the second end portion. In this illustrated example, the previously mentioned first portion thus comprises the first end portion 32, the previously mentioned second portion comprises second end portions 34, and the previously mentioned third portion comprises the intermediate portion 36.

According to one example, the heat pipe 20, 30 is a flat heat pipe. Flat heat pipes as such are previously known and can be obtained by flattening conventional cylindrical heat pipes to a relatively low thickness, e.g. approx. 0.5 mm.

In all of the examples above, the heat pipe may comprise a thermal contact area that is configured for thermal contact with a heat generating component comprising a pluggable module.

Example embodiments of a receptacle assembly 70 are shown in FIGS. 5-9. The receptacle assembly 70 comprises a frame 72 having an interior cavity 73 configured for accommodating a heat generating component 40, e.g. a pluggable module such as a SFP or QSFP. The frame 72 has an opening 75 for receiving the heat generating component. The receptacle assembly comprises a cooling device 10 as described in any one the examples above. It may be mentioned that what is here called a frame 70 would correspond to what is sometimes called a cage in prior art.

Figure 5:
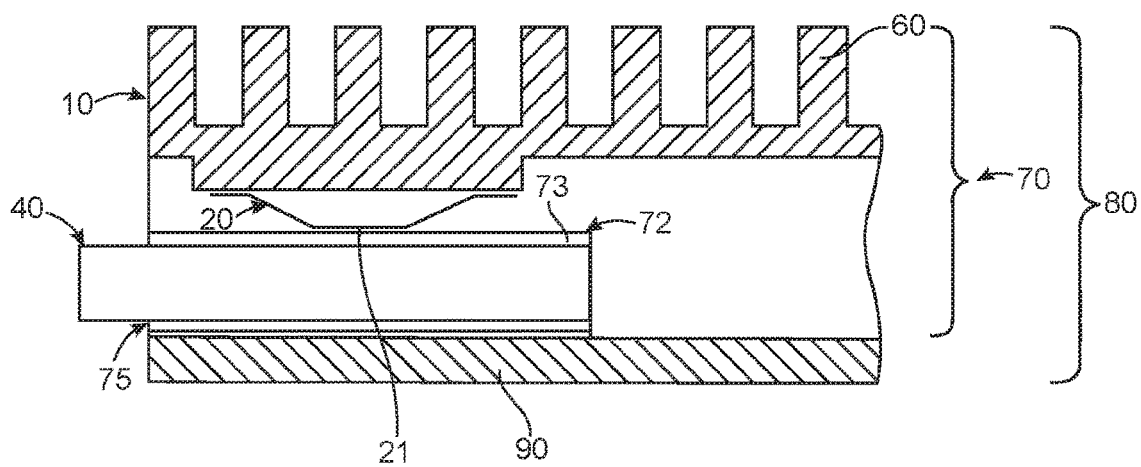
FIG. 5 illustrates schematically an example embodiment of a receptacle assembly, a system and a PBA, according to the present disclosure.
Figure 6:
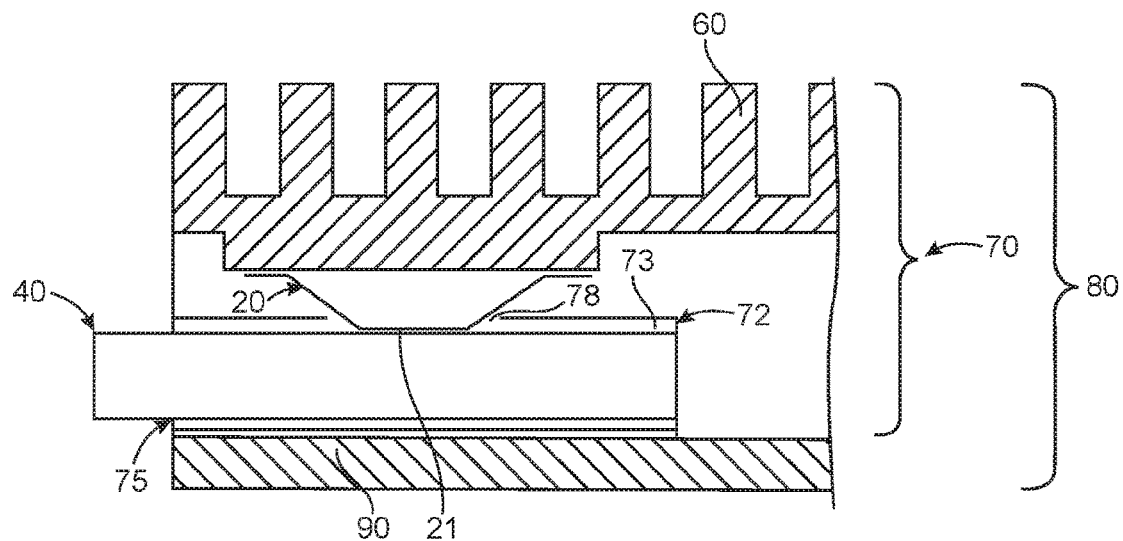
FIG. 6 illustrates schematically an example embodiment of a receptacle assembly, a system and a PBA, according to the present disclosure.
Figure 7:
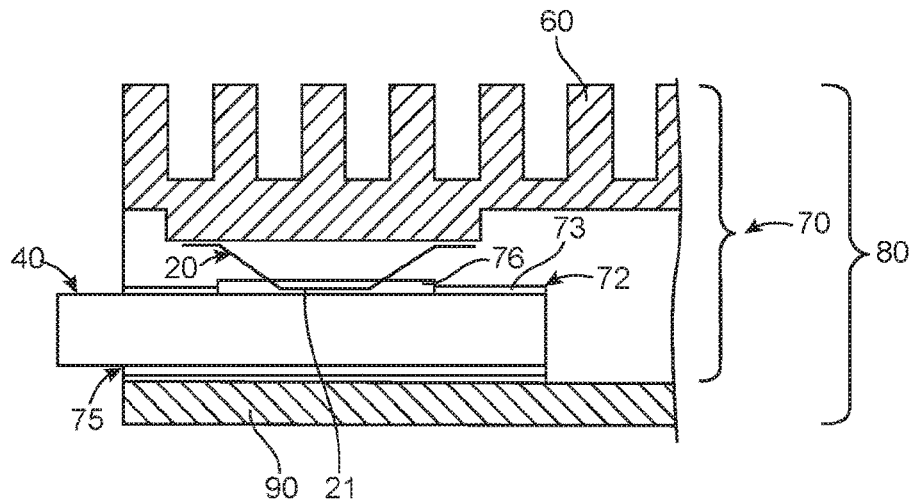
FIG. 7 illustrates schematically an example embodiment of a receptacle assembly, a system and a PBA, according to the present disclosure.

In one example of a receptacle assembly, the heat pipe 20, 30 of the cooling device 10 is configured to be in thermal contact with a heat generating component 40 via a heat transfer element 76 of the frame 72 and/or directly with the heat generating component 40, as shown in FIG. 6. A heat transfer element of the frame may e.g. be the frame itself, as shown in FIG. 5, or an element supported in the frame, as shown in FIG. 7.

Figure 8:
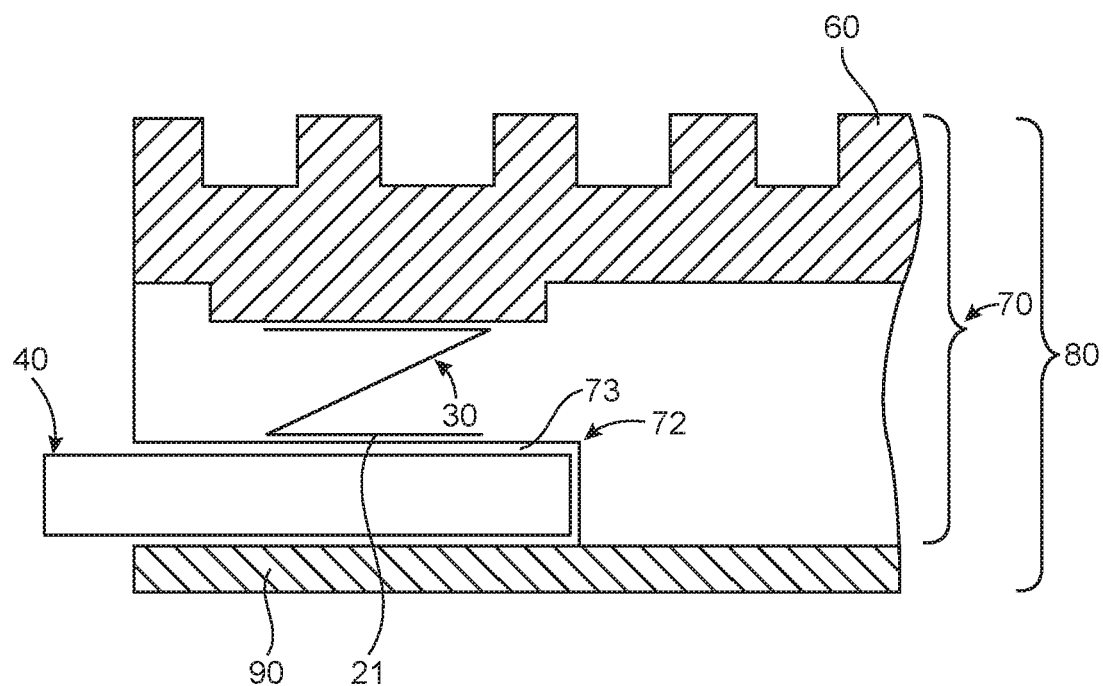
FIG. 8 illustrates schematically an alternative example embodiment of a receptacle assembly, a system and a PBA, according to the present disclosure.

According to one example is disclosed a receptacle assembly 70 wherein the heat pipe 20, 30 is configured to exert a biasing force on the frame 72. This example is illustrated in FIG. 5 and FIG. 8, showing two variants of cooling devices in which the heat pipe has different shapes. In one example, the heat pipe has a cross section similar to a bowl with a flat bottom and rims, and in the other example the heat pipe has a cross section in Z-form.

According to one example is disclosed a receptacle assembly 70 wherein the heat pipe 20 is configured to exert a biasing force on a heat generating component 40 during insertion into the cavity 73 of the frame 72 and to become resiliently deformed when a heat generating component 40 is inserted into the cavity of the frame. This is illustrated in FIG. 6.

In one example, the heat transfer element of the frame 72 comprises a thermally conductive element 76 supported in the frame and which thermally conductive element is configured to be in thermal contact with a heat generating component 40 accommodated in the cavity 73 of the frame. This is shown in FIG. 7. Such a thermally conductive element can e.g. comprise an aluminium block that is in thermal contact with the heat generating component. In order to accommodate such a thermally conductive element, and to enable thermal contact with the heat pipe, the frame should have an opening towards the heat pipe. The heat pipe as such may simply be in contact with the upper side of the thermally conductive element, or it may be embedded in the thermally conductive element as shown in FIG. 7.

When the heat pipe is configured to be in direct thermal contact with the heat generating component, it will be movably connected to the heat generating component, by contact only and not fastened to the heat generating component. When the heat pipe is in thermal contact with the heat generating component via the frame itself, as in FIG. 5, the heat pipe may be fastened to the frame or may be movably connected by contact only. When the heat pipe is in thermal contact with the heat generating component via a heat transfer element that is a separate element supported in the frame, such as the above mentioned thermally conductive element, the heat pipe may be fastened to the thermally conductive element or may be movably connected by contact only.

In one example, the frame 72 comprises a top opening 78 facing towards the heat sink 60, wherein the heat pipe 20 penetrates into the cavity 73 via the top opening and is configured to enter into thermal contact with a heat generating component 40 when a heat generating component is accommodated in the cavity. This is illustrated in FIG. 7.

In the shown examples of FIGS. 5-7 it has only been illustrated how the heat pipe 20 having the configuration and shape shown in FIGS. 5-7, and corresponding to the cooling device shown in FIG. 3, can be located as part of a receptacle assembly 70. However, the variant of a heat pipe 30 as shown in FIG. 8, corresponding to the cooling device shown in FIG. 4, may also be located in a corresponding manner in a receptacle assembly 70 and cooperate in a corresponding manner with, and be in thermal contact with, a heat transfer element of the frame 72 and/or with the heat generating component 40.

Figure 9:
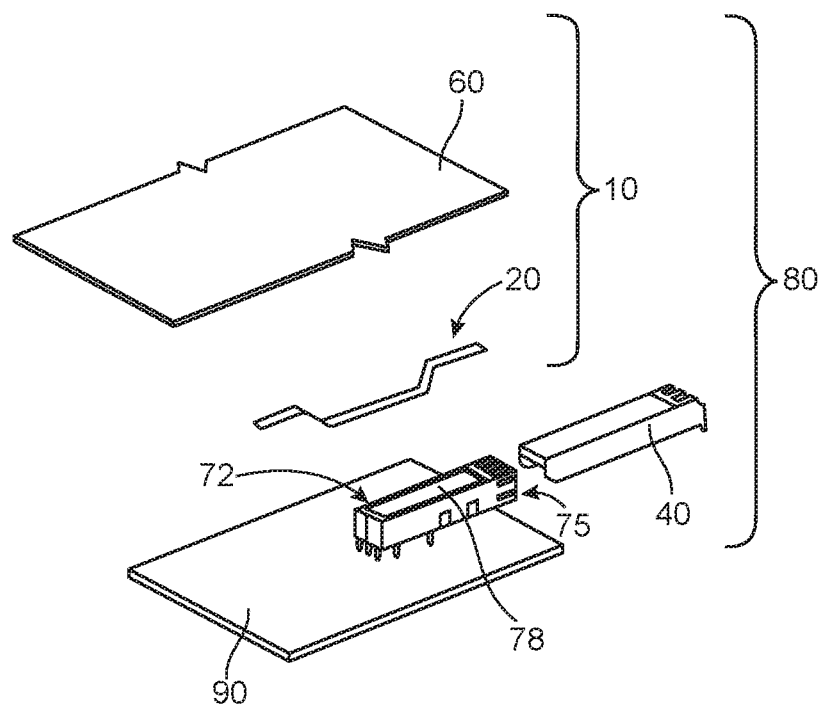
FIG. 9 illustrates schematically an exploded view of an alternative example embodiment of a receptacle assembly, a system and a PBA, according to the present disclosure.

In FIG. 9 is shown a further example embodiment. For a better understanding is disclosed an exploded view of a receptacle assembly comprising a cooling device 10, a frame 72, and also disclosing a PBA 90 and a heat generating component 40 in the form of a pluggable module. The heat pipe 20 has the shape of the heat pipe illustrated in FIG. 3. However, the heat sink 60 has an alternative shape as compared to the heat sink in FIG. 3, in that the heat sink in FIG. 9 is illustrated as a cold plate.

According to one aspect is disclosed a system 80 comprising a receptacle assembly 70 in accordance with any one of the examples described above, and the system comprises a heat generating component 40 that is insertable into the cavity 73 of the frame 72.

According to one example embodiment of the system 80, the heat generating component 40 is a pluggable module. Examples of pluggable modules and components have already been mentioned.

As mentioned, the mechanical spring property of the heat pipe is used to obtain a biasing force that will exert a pressure force against the heat generating component during insertion into a frame in which it is located during use. The pressure force is released when the heat generating component is extracted from the frame.

Reference is now made to FIGS. 5 and 8. In these examples, the heat pipe 20, 30 will be mounted to the frame 72, and the spring properties will be used to press down slightly on the frame. In such a case the spring properties of the heat pipe are used to compensate for tolerances, e.g. resulting in variations of the interspace between the frame and the heat sink. Heat transfer from the heat generating component will then take place by thermal radiation from the component to the frame, and thermal conduction from the frame to the heat pipe. The spring properties may also have an advantageous effect during the assembly of the different components in order to achieve good thermal contact between the different components.

As an alternative, the frame 72 may have an opening 78 into which the thermal contact area portion 21 of the heat pipe 20 may penetrate into the cavity 73 of the frame in order to be able to have physical contact with a heat generating component 40. This is illustrated in FIG. 6. When the heat generating component is inserted, it will press upwards against the heat pipe 20, against the biasing effect of the spring properties of the heat pipe, in order to be able to be completely inserted into the cavity 73. When the heat generating component is located inside the frame it will be in contact with the heat pipe, and heat may be transferred to the heat pipe and further to the heat sink whereby cooling is obtained. The heat pipe will thus be in a slightly compressed condition. When the heat generating component is extracted from the frame, the heat pipe will be released from its compressed condition. The heat pipe will then resume its original position and shape. The heat pipe illustrated in FIG. 6 may be substituted for the heat pipe of FIG. 4.

In another alternative, as shown in FIG. 7, the frame 72 may have an opening 78 such that a thermally conductive element 76 is supported in the frame. The thermally conductive element is configured to be in thermal contact with a heat generating component 40 when it is inserted in the cavity 73 of the frame. The heat pipe as such may simply be in contact with the upper side of the thermally conductive element, or it may be embedded in the thermally conductive element as shown in FIG. 7. The thermally conductive element 76 penetrates into the cavity 73 of the frame in order to be able to have physical contact with a heat generating component 40. When the heat generating component is inserted, it will press upwards against the thermally conductive element 76, against the biasing effect of the spring properties of the heat pipe, in order to be able to be completely inserted into the cavity 73. Once inserted, it will be kept in position by the pressure force exerted by the thermally conductive element and the heat pipe. When the heat generating component is located inside the frame it will be in contact with the heat pipe, via the thermally conductive element, and heat may be transferred from the heat generating component to the thermally conductive element and to the heat pipe and further to the heat sink whereby cooling is obtained. The heat pipe will thus be in a slightly compressed condition when the heat generating component is located in the frame. When the heat generating component is extracted from the frame, the heat pipe will be released from its compressed condition. The thermally conductive element 76 will then resume its original position and the heat pipe will resume its original position and shape. The heat pipe illustrated in FIG. 7 may be substituted for the heat pipe of FIG. 4.

According to another aspect is also disclosed a printed board assembly (PBA) 90 comprising a receptacle assembly 70 in accordance with any one of the examples described above. A PBA is schematically shown in FIGS. 5-8.

With regard to the shape of the heat pipe, many different shapes are conceivable that would provide mechanical spring properties to the heat pipe. The portions of the heat pipe that have been described as forming an acute or obtuse angle in relation to other portions of the heat pipe, and which mainly provide the spring effect, may also comprise parts of the heat pipe that have a semi-circular shape, semi-elliptical shape, or other shapes with rounded forms.

The portions of the heat pipe that are in thermal contact with the heat sink and the portions configured for thermal contact with a heat generating component may be arranged to be parallel with each other.

One heat pipe may extend across several heat generating components, usually while being in thermal contact with the heat sink inbetween every heat generating component. One heat generating component may be cooled by more than one heat pipe.

Generally, all terms used herein are to be interpreted according to their ordinary meaning in the relevant technical field, unless a different meaning is clearly given and/or is implied from the context in which it is used.

Reference has been made herein to various examples and embodiments. However, a person skilled in the art would recognize numerous variations to the described embodiments that would still fall within the scope of the claims.

Any feature of any of the examples and embodiments disclosed herein may be applied to any other embodiment/example, wherever suitable. Likewise, any advantage of any of the embodiments/examples may apply to any other embodiments/examples, and vice versa.

Hence, it should be understood that the details of the described embodiments/examples are merely examples brought forward for illustrative purposes, and that all variations that fall within the scope of the claims are intended to be embraced therein.

The invention claimed is:

1. A cooling device for cooling a heat generating component, wherein the cooling device comprises a heat sink and a heat pipe that is in thermal contact with the heat sink, wherein the heat pipe comprises a first portion having a thermal contact area that is in thermal contact with the heat generating component, a second portion that is in thermal contact with the heat sink, and a third portion that is disposed to reside between ends of the second portion and connected to the first portion, and the third portion to reside between the first portion and the second portion, and wherein the heat pipe is made of flexible material and configured in a shape that provides elastic energy storage properties and without use of a mechanical assisting device between the heat pipe and the heat sink.

2. The cooling device according to claim 1, wherein the heat generating component comprises a pluggable module.

3. The cooling device according to claim 1, wherein the third portion comprises at least a part that forms an acute angle or an obtuse angle to at least one of the first portion and the second portion, and thereby achieving mechanical spring properties.

4. The cooling device according to claim 1, wherein the second portion comprises a first end portion and a second end portion that are in thermal contact with the heat sink, wherein the third portion comprises a first connecting portion that connects the first end portion of the second portion with the first portion and a second connecting portion that connects the second end portion of the second portion with the first portion, and wherein respective first and second connecting portion comprise at least a part that form an acute angle or an obtuse angle in relation to the first end portion and the second end portion.

5. The cooling device according to claim 1, wherein the third portion connects the first portion to the second portion diagonally that forms an acute angle or an obtuse angle in relation to the second portion.

6. The cooling device according to claim 1, wherein the heat pipe is a flat heat pipe.

7. A receptacle assembly comprising a frame having an interior cavity configured for accommodating a heat generating component and having an opening for receiving the heat generating component, the receptacle assembly further comprises a cooling device, wherein the cooling device is for cooling the heat generating component, in which the cooling device comprises a heat sink and a heat pipe that is in thermal contact with the heat sink, wherein the heat pipe comprises a first portion having a thermal contact area that is in thermal contact with the heat generating component, a second portion that is in thermal contact with the heat sink, and a third portion that is disposed to reside between ends of the second portion and connected to the first portion, and the third portion to reside between the first portion and the second portion, and wherein the heat pipe is made of flexible material and configured in a shape that provides elastic energy storage properties and without use of a mechanical assisting device between the heat pipe and the heat sink.

8. The receptacle assembly according to claim 7, wherein the heat pipe is configured to exert a biasing force on the frame.

9. The receptacle assembly according to claim 7, wherein the heat pipe is configured to exert a biasing force on the heat generating component during insertion into the interior cavity of the frame and to become resiliently deformed when the heat generating component is inserted into the interior cavity of the frame.

10. The receptacle assembly according to claim 7, wherein the heat pipe is configured to be in thermal contact with the heat generating component via a heat transfer element of the frame, directly with the heat generating component, or both via the heat transfer element and directly with the heat generating component.

11. The receptacle assembly according to claim 10, wherein the frame comprises a thermally conductive element supported in the frame and forming the heat transfer element of the frame and which the thermally conductive element is configured to be in thermal contact with the heat generating component accommodated in the interior cavity of the frame.

12. The receptacle assembly according to claim 10, wherein the frame comprises a top opening facing towards the heat sink, wherein the heat pipe penetrates into the interior cavity of the frame via the top opening and is configured to enter into thermal contact with the heat generating component when the heat generating component is accommodated in the interior cavity.

13. The receptacle assembly in accordance with claim 7 disposed as part of a system, which system includes the heat generating component that is insertable into the interior cavity of the frame.

14. The receptacle assembly according to claim 13, wherein the heat generating component is a pluggable module.

15. The receptacle assembly in accordance with claim 7 disposed on a printed board assembly.

* * * * *